(12) United States Patent
Kikuchi et al.

(10) Patent No.: US 12,349,535 B2
(45) Date of Patent: Jul. 1, 2025

(54) LIGHT-EMITTING DEVICE AND DISPLAY DEVICE HAVING FIRST AND SECOND ADHESIVE LAYERS OF DIFFERENT SHEAR MODULUS

(71) Applicant: SHARP KABUSHIKI KAISHA, Sakai (JP)

(72) Inventors: Ryoh Kikuchi, Sakai (JP); Takehiro Murao, Sakai (JP); Kenichiroh Tsuchida, Sakai (JP); Yasuyuki Togashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 581 days.

(21) Appl. No.: 17/783,829

(22) PCT Filed: Dec. 26, 2019

(86) PCT No.: PCT/JP2019/051133
§ 371 (c)(1),
(2) Date: Jun. 9, 2022

(87) PCT Pub. No.: WO2021/130961
PCT Pub. Date: Jul. 1, 2021

(65) Prior Publication Data
US 2023/0018259 A1 Jan. 19, 2023

(51) Int. Cl.
*H10K 50/84* (2023.01)
*H10K 50/844* (2023.01)
*H10K 59/40* (2023.01)
*H10K 59/12* (2023.01)
*H10K 59/80* (2023.01)

(52) U.S. Cl.
CPC ......... *H10K 50/841* (2023.02); *H10K 50/844* (2023.02); *H10K 59/40* (2023.02); *H10K 59/12* (2023.02); *H10K 59/871* (2023.02); *H10K 59/8791* (2023.02)

(58) Field of Classification Search
CPC ...... H10K 50/844; H10K 59/40; H10K 59/12; H10K 50/841
See application file for complete search history.

(56) References Cited

U.S. PATENT DOCUMENTS

2015/0200375 A1* 7/2015 Kim .................. H10K 77/111
257/40
2017/0200915 A1 7/2017 Lee et al.
(Continued)

FOREIGN PATENT DOCUMENTS

JP 2017-126061 A 7/2017

*Primary Examiner* — Michael Jung
(74) *Attorney, Agent, or Firm* — ScienBiziP, P.C.

(57) ABSTRACT

A light-emitting device includes: a first layer; a second layer; a light-emitting element layer positioned between the first layer and the second layer and including a light-emitting element; a first adhesive layer positioned between the first layer and the light-emitting element layer, and having a thickness of 10 μm or greater and less than 25 μm and a shear modulus at 23 degrees Celsius of 4.0E+04 Pa or greater and less than 1.0E+05 Pa; and a second adhesive layer positioned between the light-emitting element layer and the second layer, and having a thickness of greater than 0 μm and no greater than 15 μm and a shear modulus at 23 degrees Celsius of 1.0E+05 Pa or greater.

16 Claims, 6 Drawing Sheets

(56) References Cited

U.S. PATENT DOCUMENTS

2018/0061893 A1\* 3/2018 Breedlove ............... G06F 3/041
2018/0375065 A1\* 12/2018 Hashimoto ............ G02B 5/305
2019/0081255 A1\* 3/2019 Kim ........................ B32B 15/20

\* cited by examiner

LIGHT-EMITTING DEVICE AND DISPLAY DEVICE HAVING FIRST AND SECOND ADHESIVE LAYERS OF DIFFERENT SHEAR MODULUS

TECHNICAL FIELD

The disclosure relates to a light-emitting device including a light-emitting element or a display device that uses the light-emitting device.

BACKGROUND ART

PTL 1 discloses a light-emitting device in which a plurality of layers including a layer provided with a light-emitting element are joined by adhesive layers having low elasticity, thereby suppressing the occurrence of defects such as cracking due to bending.

CITATION LIST

Patent Literature

PTL. 1: JP 2017-126061 A

SUMMARY OF INVENTION

Technical Problem

In a light-emitting device that uses an adhesive layer having low elasticity such as described in PTL 1, a problem arises that a pencil hardness of a surface of the light-emitting device is difficult to increase.

Solution to Problem

To solve the problem described above, a light-emitting device according to an aspect of the disclosure includes a first layer, a second layer, a light-emitting element layer positioned between the first layer and the second layer and including a light-emitting element, a first adhesive layer positioned between the first layer and the light-emitting element layer, and having a thickness of 10 μm or greater and less than 25 μm and a shear modulus at 23 degrees Celsius of 4.0E+04 Pa or greater and less than 1.0E+05 Pa, and a second adhesive layer positioned between the light-emitting element layer and the second layer, and having a thickness of greater than 0 μm and no greater than 15 μm and a shear modulus at 23 degrees Celsius of 1.0E+05 Pa or greater.

Advantageous Effects of Disclosure

According to an aspect of the disclosure, it is possible to provide a light-emitting device that ensures a pencil hardness of a surface while suppressing the occurrence of defects in a light-emitting element layer.

DESCRIPTION OF EMBODIMENTS

First Embodiment

Figure 1:
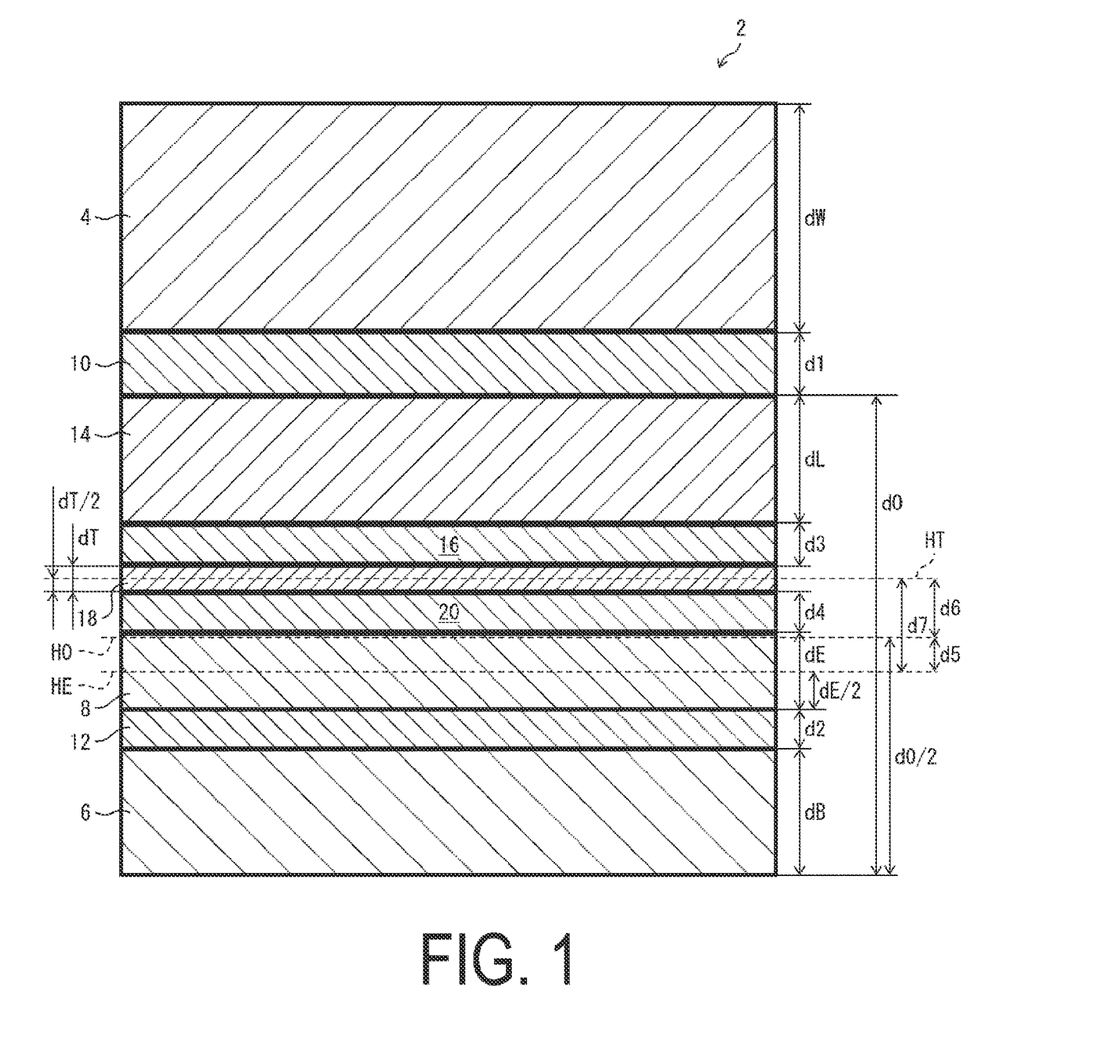
FIG. 1 is a schematic cross-sectional view of a light-emitting device according to a first embodiment of the disclosure.

FIG. 1 is a schematic cross-sectional view of a light-emitting device 2 according to the present embodiment. Note that each of the drawings described in the present specification, including FIG. 1, is a schematic view and is not intended to indicate a specific scale of each member. First, the specific structure of the light-emitting device 2 according to the present embodiment will be described with reference to FIG. 1.

The light-emitting device 2 according to the present embodiment includes a window film 4 as a first layer, a back film 6 as a second layer, and a light-emitting element layer 8 including a light-emitting element described in detail below. The light-emitting element layer 8 is positioned between the window film 4 and the back film 6. Further, the light-emitting device 2 includes a first adhesive layer 10 positioned between the window film 4 and the light-emitting element layer 8, and further includes a second adhesive layer 12 positioned between the back film 6 and the light-emitting element layer 8.

In the present embodiment, the light-emitting device 2 includes an optical layer 14 between the light-emitting element layer 8 and the first adhesive layer 10, and includes a third adhesive layer 16 between the light-emitting element layer 8 and the optical layer 14. Furthermore, the light-emitting device 2 includes a touch panel layer 18 between the light-emitting element layer 8 and the third adhesive layer 16, and includes a fourth adhesive layer 20 between the light-emitting element layer 8 and the touch panel layer 18.

Therefore, as illustrated in FIG. 1, the light-emitting device 2 includes the light-emitting element layer 8, the touch panel layer 18, the optical layer 14, and the window film 4 layered in this order from the back film 6 side. Further, the first adhesive layer 10 bonds the window film 4 and the optical layer 14. The second adhesive layer 12 bonds the back film 6 and the light-emitting element layer 8. The third adhesive layer 16 bonds the optical layer 14 and the touch panel layer 18. The fourth adhesive layer 20 bonds the light-emitting element layer 8 and the touch panel layer 18.

Next, each layer of the light-emitting device 2 according to the present embodiment will be described in detail.

The window film 4 is a film having transparency formed in an outermost layer of the light-emitting device 2 on a display surface side. Therefore, in the present embodiment, light from the light-emitting element included in the light-emitting element layer 8 described below is extracted from the light-emitting element layer 8 to the window film 4 side.

The window film 4 may be a film known in the related art to be formed on a display surface of a light-emitting device, such as a polyethylene terephthalate (PET) film. Further, the light-emitting device 2 may also include, in place of the window film 4, a cover glass that is thin enough to be bendable. Note that the window film 4 has a thickness dWas illustrated in FIG. 1.

The back film 6 is a film formed in an outermost layer of the light-emitting device 2 on the side opposite to the display surface side, and may have light-shielding properties. However, the back film 6 may have transparency and, in this case, the light-emitting device 2 may constitute a double-sided light-emitting device that also extracts light, which is from the light-emitting element layer 8, on the back film 6 side as well from the light-emitting element layer 8.

The back film 6 may be a film known in the related art to be formed on a back surface of a light-emitting device, such as a PET film. Further, the light-emitting device 2 may also include, in place of the back film 6, a glass substrate that is thin enough to be bendable. Note that the back film 6 has a thickness dB as illustrated in FIG. 1.

Figure 2:
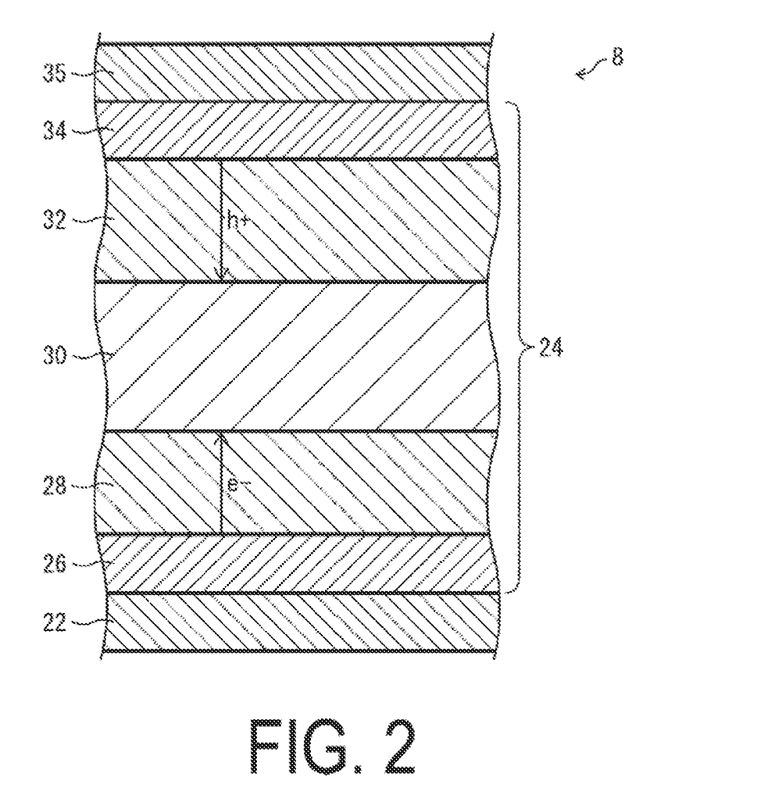
FIG. 2 is a schematic cross-sectional view of a light-emitting element layer according to the first embodiment of the disclosure.

The light-emitting element layer 8 will now be described more in detail with reference to FIG. 2. FIG. 2 is a schematic cross-sectional view illustrating the light-emitting element layer 8 according to the present embodiment. As illustrated in FIG. 2, the light-emitting element layer 8 has a structure including a light-emitting element 24 on an array substrate 22. For example, the light-emitting element 24 includes a cathode electrode 26, an electron transport layer 28, a light-emitting layer 30, a hole transport layer 32, and an anode electrode 34 in this order from the array substrate 22 side. Note that, as illustrated in FIG. 2, the light-emitting element layer 8 may include a sealing layer 35 including an organic or inorganic sealing material that seals the light-emitting element 24.

The cathode electrode 26 may be driven via a drive circuit (not illustrated) including a thin film transistor (EFT) or the like formed on the array substrate 22, and a constant potential may be applied to the anode electrode 34. In this case, by the driving of the cathode electrode 26, electrons are injected from the cathode electrode 26 into the light-emitting layer 30 via the electron transport layer 28, and positive holes are injected from the anode electrode 34 into the light-emitting layer 30 via the hole transport layer 32.

The light-emitting layer 30 includes a luminescent body that emits light by recombination of the electrons and the positive holes being injected. As a result, light from the luminescent body included in the light-emitting layer 30 is obtained from the light-emitting element layer 8. For example, in a case in which the light-emitting element layer 8 includes the anode electrode 34 on the display surface side of the light-emitting device 2, preferably the anode electrode 34 has transparency and the cathode electrode 26 has light reflectivity.

The array substrate 22 may be formed by techniques known in the related art including forming each electrode of the TFT by sputtering or the like.

The cathode electrode 26 and the anode electrode 34 may each be obtained by forming a film of a metal material by a technique such as sputtering. The electron transport layer 28 and the hole transport layer 32 may be respectively formed by forming films of an electron transport material and a hole transport material by a technique known in the related art such as photolithography, application, or vapor deposition.

As the luminescent body, the light-emitting layer 30 may include a luminescent body known in the related art in which light is generated by recombination of the electrons and the positive holes in the light-emitting layer 30, such as a fluorescent material, a phosphorescent material, or a quantum dot material. For example, in a case in which the light-emitting layer 30 includes an organic light-emitting material such as an organic fluorescent material, an organic phosphorescent material, or the like as the luminescent body, the light-emitting element 24 may be an organic light-emitting diode (OLED). Further, for example, in a case in which the light-emitting layer 30 includes a quantum dot material as the luminescent body, the light-emitting element 24 may be a quantum dot light-emitting diode (QLED). The light-emitting layer 30 may be formed by film formation of a material including a luminescent body by a technique known in the related art such as photolithography, application, or vapor deposition.

The sealing layer 35 may be formed by film formation of a sealing material by a technique known in the related art such as application or vapor deposition.

Note that the array substrate 22 may include a plurality of drive circuits, and the light-emitting element 24 may include a plurality of cathode electrodes 26. Further, each cathode electrode 26 may be individually driven by the drive circuits of the array substrate 22. Furthermore, the light-emitting layer 30 may include a plurality of light-emitting layers that emit light having colors different from one another for each of the cathode electrodes 26. In this case, the light-emitting device 2 may constitute a display device.

Note that, as illustrated in FIG. 1, the light-emitting element layer S has a thickness dE.

The optical layer 14 may be an antireflection layer having a function of transmitting light from the light-emitting element layer 8 while blocking external light that enters the light-emitting device 2 from the window film 4 side and is reflected in an interior of the light-emitting device 2, ensuring that the light is not once again emitted to outside the light-emitting device 2. For example, the optical layer 14 may include a circular polarizing film, and the circular polarizing film may be formed by bonding a linear polarizing film and a λ/4 retardation film.

The optical layer 14 may be formed by a technique known in the related art for forming a polarizer. Note that, as illustrated in FIG. 1, the optical layer 14 has a thickness dL.

The touch panel layer 18 includes, for example, a touch panel that detects the presence or absence of contact with a human finger or other object and a position of contact on an outer surface on the window film 4 side of the light-emitting device 2. The touch panel layer 18 may execute the detection described above by a method known in the related art including an electrostatic capacitance method, a film resistance method, or the like. The touch panel layer 18 may be formed by techniques known in the related art including formation of each electrode of the touch panel by sputtering or the like. Note that, as illustrated in FIG. 1, the touch panel layer 18 has a thickness dT.

The first adhesive layer 10, the second adhesive layer 12, the third adhesive layer 16, and the fourth adhesive layer 20 are all adhesive materials having flexibility and transparency. However, in a case in which the light from the light-emitting element layer 8 is extracted from only the window film 4 side of the light-emitting device 2, the second adhesive layer 12 may have light-shielding properties or light reflectivity.

The first adhesive layer 10, the second adhesive layer 12, the third adhesive layer 16, and the fourth adhesive layer 20 may be adhesive materials having flexibility and transparency known in the related art, including, for example, an optical clear adhesive (OCA) film. The first adhesive layer 10, the second adhesive layer 12, the third adhesive layer 16, and the fourth adhesive layer 20 may be formed by techniques known in the related art, such as, for example, bonding an OCA film and subsequently heating the film for deaeration and curing the film by ultraviolet irradiation. In addition, the first adhesive layer 10, the second adhesive layer 12, the third adhesive layer 16, and the fourth adhesive layer 20 may be formed by, for example, a technique of applying an adhesive material, adhering two layers to be bonded, and subsequently drying the adhesive material by heating or curing the adhesive material by ultraviolet irradiation.

The first adhesive layer 10 is a relatively flexible and thick adhesive layer. Specifically, as illustrated in FIG. 1, the first adhesive layer 10 has a thickness d1, and d1 is 10 μm or greater and less than 25 μm. Further, a shear modulus at 23 degrees Celsius of the first adhesive layer is 4.0E+04 Pa or greater and less than 1.0E+05 Pa. Furthermore, a shear modulus at minus 20 degrees Celsius of the first adhesive layer is 4.0E+04 Pa or greater and less than 5.0E 05 Pa.

The second adhesive layer 12, the third adhesive layer 16, and the fourth adhesive layer 20 are relatively stiff and thin adhesive layers. Specifically, as illustrated in FIG. 1, the second adhesive layer 12, the third adhesive layer 16, and the fourth adhesive layer 20 have thicknesses d2, d3, and d4, respectively, and d2, d3, and d4 are greater than 0 μm and no greater than 15 μm. Further, the shear modulus at 23 degrees Celsius of the second adhesive layer 12, the third adhesive layer 16, and the fourth adhesive layer 20 are each 1.0E+05 Pa or greater. Furthermore, the shear modulus at minus 20 degrees Celsius of the second adhesive layer 12, the third adhesive layer 16, and the fourth adhesive layer 20 are each 1.0E+06 Pa or greater.

Note that, in the present specification, 23 degrees Celsius may henceforth be referred to as room temperature. Further, in the present specification, an adhesive layer having a shear modulus of less than 1.0E+05 Pa at room temperature may be referred to as a soft adhesive layer. Likewise, in the present specification, an adhesive layer having a shear modulus of 1.0E+05 Pa or greater at room temperature may be referred to as a hard adhesive layer. As described above, the adhesive layers including the first adhesive layer 10, the second adhesive layer 12, the third adhesive layer 16, and the fourth adhesive layer 20 tend to rise in shear modulus under low temperatures as compared to under room temperature.

Note that the thicknesses and shear modulus of the second adhesive layer 12, the third adhesive layer 16, and the fourth adhesive layer 20 may be different from one another or may be equal to one another.

Figure 3:
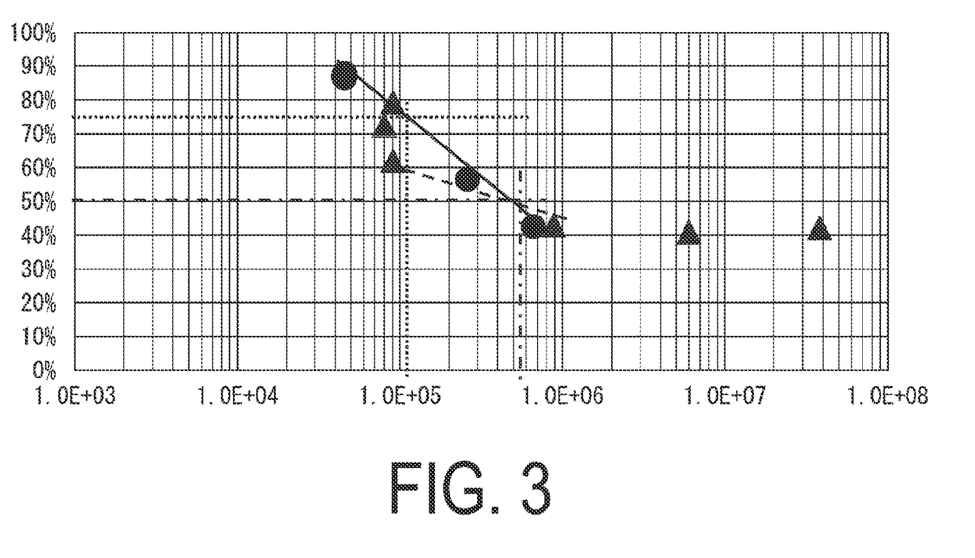
FIG. 3 is a graph showing a relationship between a shear modulus and a permissible shift rate of an adhesive layer according to the first embodiment of the disclosure.

Here, a relationship between an elastic modulus of an adhesive layer and a permissible shift rate of the adhesive layer will be described with reference to FIG. 3. FIG. 3 is a graph showing the relationship between the shear modulus and the permissible shift rate of the adhesive layer. In the graph in FIG. 3, the horizontal axis shows a shear modulus and the vertical axis shows a permissible shift rate of the adhesive layer having that shear modulus. Note that the graph of FIG. 3 is a single logarithmic graph with only the horizontal axis set to a logarithmic scale. Further, the unit of shear modulus is Pa.

Here, the permissible shift rate of the adhesive layer is a parameter that indicates a maximum distance that an adhesive layer with a certain thickness absorbs shift in a direction orthogonal to a thickness direction, that is, in a planar direction, as a percentage with respect to the thickness of the adhesive layer.

In the graph of FIG. 3, a circle indicates measurement values of the shear modulus and the permissible shift rate at room temperature, that is, 23 degrees Celsius, and a triangle indicates measurement values of the shear modulus and the permissible shift rate at minus 10 degrees Celsius.

As shown in the graph in FIG. 3 with supplementation by a solid line, in a case in which the adhesive layer under room temperature has a shear modulus of about 1.0E+06 Pa or less, the lower the shear modulus, the higher the permissible shift rate. In particular, as shown in the graph of FIG. 3 by dotted lines, an adhesive layer having a shear modulus of 1.0E+05 Pa under room temperature has a permissible shift rate of 75?. Accordingly, an adhesive layer having a shear modulus of less than 1.0E+05 Pa under room temperature better absorbs shift associated with bending in the direction orthogonal to the thickness direction.

As shown in the graph in FIG. 3 with supplementation by a dashed line, in a case in which the adhesive layer at minus 10 degrees Celsius has a shear modulus of about 1.0E+06 Pa or less, the lower the shear modulus, the higher the permissible shift rate. In particular, as shown in the graph of FIG. 3 by dash-dot lines, an adhesive layer having a shear modulus of 5.0E+05 Pa under an environment of minus 10 degrees Celsius has a permissible shift rate of 50%. Accordingly, an adhesive layer having a shear modulus of less than 5.0E+05 Pa at a low temperature better absorbs shift associated with bending in the direction orthogonal to the thickness direction.

Note that, as shown in the graph in FIG. 3, in a case in which the adhesive layer at minus 10 degrees Celsius has a shear modulus of about 1.0E+06 Pa or greater, fluctuation in the shear modulus does not contribute much to fluctuation in the permissible shift rate. In other words, in a case in which the shear modulus of the adhesive layer is 1.0E+06 Pa or greater, deterioration of the permissible shift rate of the adhesive layer is less likely to occur due to a rise in the shear modulus of the adhesive layer.

The light-emitting device 2 according to the present embodiment includes the first adhesive layer 10 having a thickness of 10 μm or greater and a shear modulus at 23 degrees Celsius of less than 1.0E+05 Pa. In other words, the first adhesive layer 10 has a relatively high permissible shift rate and a relatively thick thickness.

Therefore, the first adhesive layer 10 better absorbs the shift between the two layers to be bonded in the direction orthogonal to the thickness direction, in other words, in the planar direction of the light-emitting device 2.

In general, in a light-emitting device including a light-emitting element layer or a touch panel layer, in a case in which shift in the planar direction of the light-emitting device is propagated to the light-emitting element layer or the touch panel layer, a defect such as cracking is likely to occur in the light-emitting element layer or the touch panel layer. Nevertheless, in a case in which the light-emitting device includes a layer that absorbs the shift in the planar direction of the light-emitting device, the shift is less likely to propagate to the light-emitting element layer or the touch panel layer.

Accordingly, in the light-emitting device 2 including the first adhesive layer 10, the light-emitting element layer 8 and the touch panel layer 18 improve in tolerability to bending and the like, making it possible to suppress the occurrence of defects in the light-emitting element layer 8 and the touch panel layer 18.

Further, the first adhesive layer 10 has a shear modulus of less than 5.0E+05 Pa even at low temperatures. Therefore, the light-emitting device 2 can ensure tolerability to bending and the like and can suppress the occurrence of defects, even at low temperatures.

On the other hand, the light-emitting device 2 according to the present embodiment includes the second adhesive layer 12, the third adhesive layer 16, and the fourth adhesive layer 20, each having a thickness of 15 μm or less and a shear modulus at 23 degrees Celsius of 1.0E+05 Pa or greater. In other words, the second adhesive layer 12, the third adhesive layer 16, and the fourth adhesive layer 20 each have a relatively high shear modulus and a relatively thin thickness.

In general, in a light-emitting device having a layered structure, a light-emitting device having a higher elastic modulus and including a thin layer tends to improve in pencil hardness at the outermost surface of the light-emitting device. Accordingly, the light-emitting device 2 including the second adhesive layer 12, the third adhesive layer 16, and the fourth adhesive layer 20 improves in pencil hardness at the outermost surface. Further, under low temperatures, the shear modulus of the second adhesive layer 12, the third adhesive layer 16, and the fourth adhesive layer 20 are each 1.0E+06 Pa or greater, and the pencil hardness of the light-emitting device 2 at the outermost surface is further improved.

Further, as described above, in a case in which the shear modulus of the adhesive layer is 1.0E+06 Pa or greater, deterioration of the permissible shift rate of the adhesive layer is less likely to occur due to a rise in the shear modulus of the adhesive layer. Therefore, the second adhesive layer 12, the third adhesive layer 16, and the fourth adhesive layer 20 have a small effect on the tolerability of the light-emitting device 2 to bending and the like. This also holds true in a case in which the shear modulus of the second adhesive layer 12, the third adhesive layer 16, and the fourth adhesive layer 20 rise under low temperatures.

Note that, in the first adhesive layer 10 as well, the thickness is less than 25 μm and the shear modulus at 23 degrees Celsius is 4.0E+04 Pa or greater. Therefore, the effect of the first adhesive layer 10 on the pencil hardness of the light-emitting device 2 is small.

Accordingly, the light-emitting device 2 including the first adhesive layer 10, the second adhesive layer 12, the third adhesive layer 16, and the fourth adhesive layer 20 provides an effect of ensuring the pencil hardness of the surface while suppressing the occurrence of defects in the light-emitting element layer 8 and the touch panel layer 18.

Note that, in the present embodiment, the light-emitting device 2 need only include the first adhesive layer 10 on one side of the light-emitting element layer 8 in the thickness direction, and the second adhesive layer 12 on the side of the light-emitting element layer 8 opposite to the first adhesive layer 10. The light-emitting device 2 having this configuration provides an effect of ensuring the pencil hardness of the surface while suppressing the occurrence of defects in the light-emitting element layer 8.

As described above, in the present embodiment, a display device may be configured using the light-emitting device 2. This enables realization of a foldable display device having greater reliability or higher performance and capable of ensuring pencil hardness of the surface while suppressing defects in the light-emitting element layer 8 and touch panel layer 18.

Next, positions of the light-emitting element layer 8 and the touch panel layer 18 in the light-emitting device 2 will be described in detail with reference to FIG. 1 and FIG. 4.

Figure 4:
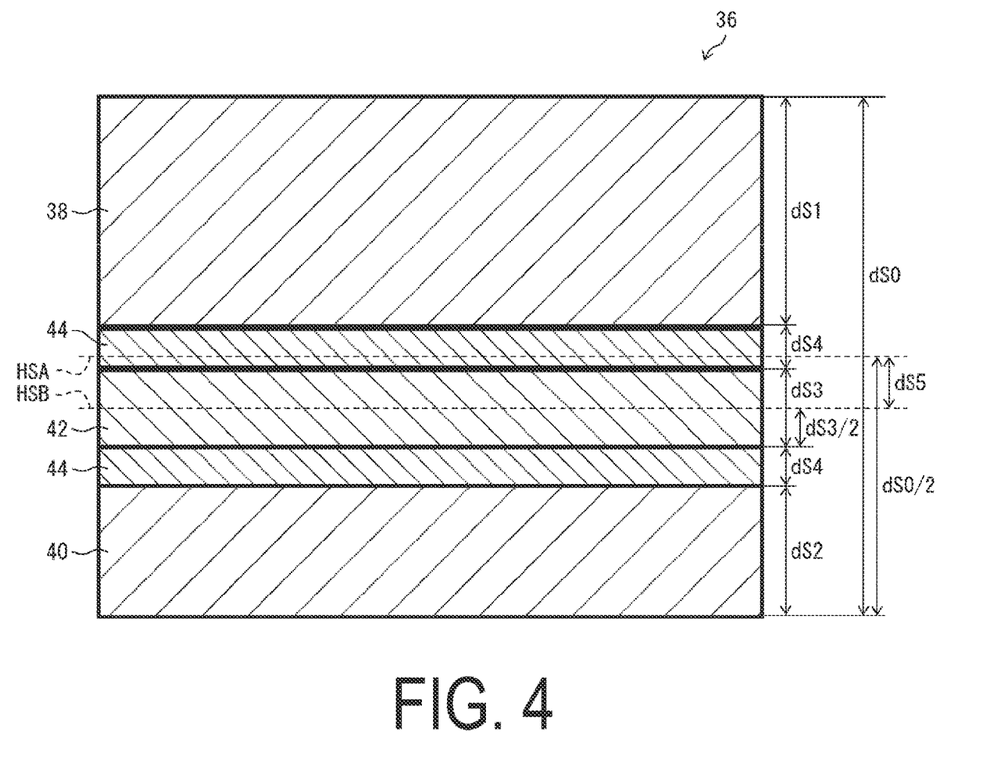
FIG. 4 is a schematic cross-sectional view of a test sample according to the first embodiment of the disclosure.

FIG. 4 is a schematic cross-sectional view of a test sample 36 for verifying the effect of a distance between a center position of a total thickness of the layered structure and a center position of a specific layer on the shift in the planar direction of the layered structure that occurs in the specific layer during bending of the layered structure.

The test sample 36 includes a test layer 42 between an upper layer 38 having a thickness dS1 and a lower layer 40 having a thickness dS2. Further, the upper layer 38, the lower layer 40, and the test layer 42 are bonded to one another via test adhesive layers 44 having a thickness dS4. Therefore, a total thickness dS0 of the test sample 36 is dS1 dS2+dS3+2dS4. Note that each layer of the test sample 36 includes a bendable, flexible material.

Here, as illustrated in FIG. 4, the test sample 36 has a center position HSA of the total thickness. In other words, the test sample 36 has the center position HSA at a distance from one end face in a thickness direction of the test sample 36 that is half of the total thickness dS0 of the test sample 36, that is, dS0/2.

Similarly, as illustrated in FIG. 4, the test layer 42 has a center position HSB in the thickness direction. In other words, the test layer 42 has the center position HSB at a distance from one end face in the thickness direction of the test layer 42 that is half of the thickness of the test layer 42, that is, dS3/2.

Here, the distance between the center position HSA of the test sample 36 and the center position HSB of the test layer 42 is denoted as dS5. In this case, the distance dS5 is expressed as, for example, |dS0/2 (dS2+dS4+dS3/2)|=|(dS1-dS2)/2|. That is, the distance between the center position HSA and the center position HSB can be changed by changing the thicknesses of the upper layer 38 and the lower layer 40.

Note that, in a case in which (dS1-dS2)/2 is positive, the center position HSA is on the upper layer 38 side of the center position HSB and, in a case in which the (dS1-dS2)/2 is negative, the center position HSA is on the lower layer 40 side of the center position HSB.

Here, a plurality of the test samples 36 were manufactured, each provided with the test layer 42 of the test sample 36 as the light-emitting element layer 8 or the touch panel layer 18 described above and each having different thicknesses of the upper layer 38 and lower layer 40, and an experiment of bending each test sample 36 was conducted. The experiment was conducted by bending each test sample 36 into a tear drop shape 10,000 times under a low temperature environment at minus 10 degrees Celsius.

In this experiment, the thickness dS4 of the test adhesive layer 44 was 15 μm, the thickness of the light-emitting element layer 8 was 30 μm, and the thickness of the touch panel layer 18 was 10 μm. Further, the shear modulus of the test adhesive layer 44 was 2.5E+05 lea. Therefore, similarly to the second adhesive layer 12, the third adhesive layer 16, and the fourth adhesive layer 20, the test adhesive layer 44 has a relatively high shear modulus and a thin adhesive layer.

After the experiment of bending each test sample 36, the light-emitting element layer 8 or the touch panel layer 18 of each test sample 36 was inspected for proper operation. The results of the inspection are summarized in Table 1 below.

TABLE 1

|  | | Light-emitting element layer | Touch panel layer |
|---|---|---|---|
| Difference between center positions | +50 μm | Poor | Poor |
|  | +37.5 μm | Poor | Poor |
|  | +35 μm | Good | Good |
|  | +31.5 μm | Good | Good |

TABLE 1-continued

|  | Light-emitting element layer | Touch panel layer |
|---|---|---|
| ±0 μm | Good | Good |
| −31.5 μm | Good | Good |
| −35 μm | Good | Good |
| −37.5 μm | Poor | Poor |
| −50 μm | Poor | Poor |

The "Difference between center positions" area in Table 1 indicates the shift amount of the center position HSB of the test layer 42 from the center position HSA of the total thickness of each test sample 36, specifically the value of (dS1-dS2)/2 of each test sample 36. Therefore, the absolute value of numerical value of the "Difference between center positions" corresponds to the distance dS5 between the center position HSA of the test sample 36 and the center position HSB of the test layer 42.

Table 1 shows an evaluation of a case in which the test layer 42 is the light-emitting element layer 8 in the "Light-Emitting Element Layer" column, and the evaluation of a case in which the test layer 42 is the touch panel layer 18 in the "Touch Panel Layer" column. The evaluation result was indicated as "Good" when the light-emitting element layer 8 or the touch panel layer 18 operated normally after the experiment described above, and "Poor" when it did not.

As is clear from Table 1, as long as the distance dS5 between the center position HSA and the center position HSB is 35 μm or less, both the light-emitting element layer 8 and the touch panel layer 18 operate normally even after bending the test sample 36. Note that, as is clear from Table 1, this does not depend on a vertical relationship between the center position HSA and the center position HSB.

With reference to FIG. 1 once again, the light-emitting element layer 8 has a center position HE in the thickness direction. In other words, the light-emitting element layer 8 has the center position HE at a distance from one end face in the thickness direction of the light-emitting element layer 8 that is half of the thickness of the light-emitting element layer 8, that is, dE/2.

Similarly, as illustrated in FIG. 1, the touch panel layer 18 has a center position HT in the thickness direction. In other words, the touch panel layer 18 has the center position HI at a distance from one end face in the thickness direction of the touch panel layer 18 that is half of the thickness of the touch panel layer 18, that is, dT/2.

Here, a total thickness of the layers bonded by the hard adhesive layers, in other words, from the back film 6 to the optical layer 14 bonded by the second adhesive layer 12, the third adhesive layer 16, and the fourth adhesive layer 20, is d0. That is, the thickness d0 is dB+d2+dE+d4+dT+d3+dL.

Further, a center position from the back film 6 to the optical layer 14 in the thickness direction is denoted as HO. In other words, the center position HO is a position at a distance from an end face of the back film 6 on the outermost surface side of the light-emitting device 2, or from an end face of the optical layer 14 on the window film 4 side, that is half of the total thickness from the back film 6 to the optical layer 14, that is, d0/2.

Here, a distance between the center position HE and the center position HO is denoted as d5. Here, d5 is expressed as, for example, |d0/2-(dB+d2+dE/2)|. Further, a distance between the center position HE and the center position HO is denoted as d6. Here, d6 is expressed as, for example, d0/2 (dL+d3+dT/2). Furthermore, a distance between the center position HE and the center position HT is denoted as d7. Here, d7 is expressed as dE/2 d4 dT/2.

As is clear from the experiment results related to the bending of the test sample 36 summarized in Table 1, the distance d5 is preferably from 0 μm to 35 μm. As long as the distance d5 is within this range, it is possible to suppress the occurrence of defects in the light-emitting element layer 8 associated with the bending of the light-emitting device 2. Similarly, the distance d6 is preferably from 0 μm to 35 μm. As long as the distance d6 is within this range, it is possible to suppress the occurrence of defects in the touch panel layer 18 associated with the bending of the light-emitting device 2.

Further, in a case in which the distance d5 and the distance d6 are within the range described above, preferably the distance d7 is greater than 0 μm, and no greater than 35 μm. In this way, the light-emitting element layer 8 and the touch panel layer 18 are positioned close to each other, making it possible to suppress the occurrence of defects associated with the bending of the light-emitting device 2 in both the light-emitting element layer 8 and the touch panel layer 18.

Note that the thickness do described above does not include the thicknesses of the window film 4 and the first adhesive layer 10. Nevertheless, the first adhesive layer 10 is relatively thick and has a low shear modulus as described above, and thus significantly absorbs the shift in the planar direction of the light-emitting device 2. Therefore, any shift in the planar direction of the light-emitting device 2 due to the bending of the light-emitting device 2 caused by the thicknesses of the window film 4 and the first adhesive layer 10 is largely absorbed by the first adhesive layer 10 and less likely to propagate to the back film 6 side of the first adhesive layer 10.

Therefore, discussions on the positions of the light-emitting element layer 8 and the touch panel layer 18 in the light-emitting device 2 from the viewpoint of reducing defects in the light-emitting element layer 8 and the touch panel layer 18 can exclude the thicknesses of the window film 4 and the first adhesive layer 10.

Light-emitting devices were manufactured according to example 1, example 2, example 3, comparative example 1, and comparative example 2 on the basis of the embodiment described above.

The light-emitting devices according to each example and comparative example have the same configuration as that of the light-emitting device 2 according to the present embodiment except for the material of each adhesive layer. In particular, in the light-emitting devices according to each example and each comparative example, dW is 90 μm, dB is 50 μm, dE is 30 μm, dL is 50 μm, and dT is 10 μm. Further, in the light-emitting devices according to each example and each comparative example, d1 is 25 μm, and d2, d3, and d4 are all 15 μm.

Here, the materials used for each of the first adhesive layer 10, the second adhesive layer 12, the third adhesive layer 16, and the fourth adhesive layer 20 of the light-emitting devices according to each example and each comparative example are shown in Table 2 below. The shear modulus of adhesive A, adhesive B, adhesive C, and adhesive D, which are the materials of the adhesive layers described in Table 2, are shown in Table 3 below.

TABLE 2

|  | Comparative example 1 | Comparative example 2 | Example 1 | Example 2 | Example 3 |
|---|---|---|---|---|---|
| First adhesive layer (25 μm) | Adhesive A | Adhesive A | Adhesive A | Adhesive A | Adhesive A |
| Second adhesive layer (15 μm) | Adhesive A | Adhesive B | Adhesive C | Adhesive D | Adhesive C |
| Third adhesive layer (15 μm) | Adhesive A | Adhesive B | Adhesive A | Adhesive D | Adhesive C |
| Fourth adhesive layer (15 μm) | Adhesive A | Adhesive B | Adhesive C | Adhesive D | Adhesive C |

TABLE 3

|  |  | Adhesive A | Adhesive B | Adhesive C | Adhesive D |
|---|---|---|---|---|---|
| Elastic modulus (Pa) | Room temperature | 4.2E+04 | 8.0E+04 | 2.3E+05 | 1.1E+05 |
|  | Low temperature | 1.1E+05 | 2.0E+05 | 6.8E+07 | 9.6E+05 | in Table 2, the "First adhesive layer (25 μm)" row shows the type of adhesive used for the first adhesive layer 10 of the light-emitting device according to each example and each comparative example. The "Second adhesive layer (15 μm)" row shows the type of adhesive used for the second adhesive layer 12 of the light-emitting device according to each example and each comparative example. The "Third adhesive layer (15 μm)" row shows the type of adhesive used for the third adhesive layer 16 of the light-emitting device according to each example and each comparative example. The "Fourth adhesive layer (15 μm)" row shows the type of adhesive used for the fourth adhesive layer 20 of the light-emitting device according to each example and each comparative example.

In Table 3, the "Elastic modulus (Pa)" "Room temperature" row shows the shear modulus of each adhesive at 23 degrees Celsius in units of Pa. Further, the "Elastic modulus (Pa)" "Low temperature" row shows the shear modulus of each adhesive at minus 20 degrees Celsius in units of Pa.

As shown in Table 3, the adhesive A and the adhesive B are adhesives used in soft adhesive layers having a shear modulus at room temperature of less than 1.0E 05 Pa, as in the first adhesive layer 10 in the present embodiment. Further, the adhesive C and the adhesive D are adhesives used in hard adhesive layers having a shear modulus at room temperature of 1.0E+05 Pa or greater, as in the second adhesive layer 12, the third adhesive layer 16, and the fourth adhesive layer 20 in the present embodiment.

The light-emitting devices according to each example and comparative example manufactured as described above were measured for pencil hardness at the outermost surface on the window film 4 side and for tolerability to bending.

The pencil hardness at the outermost surface on the window film 4 side was measured in accordance with the method for measuring scratch hardness of HS K 5600. However, during pencil hardness measurement, the load applied to the tip of the pencil was 500 g. In the measurement of pencil hardness described above, in a case in which there was damage to the outermost surface on the window film 4 side by a pencil having a hardness of 2 H or greater, the evaluation result was indicated as "Poor." Further, in the measurement of pencil hardness described above, in a case in which there was no damage to the outermost surface on the window film 4 side by a pencil having a hardness of 2 H or greater, the evaluation result was indicated as "Good."

Further, the tolerability to bending was measured by implementing bending tests on the light-emitting devices according to each example and each comparative example under room temperature and under low temperature. The bending test under room temperature was implemented by bending the light-emitting devices according to each example and each comparative example into a tear drop shape 200,000 times at 23 degrees Celsius. The bending test under low temperature was implemented by bending the light-emitting devices according to each example and each comparative example into a tear drop shape 10,000 times at minus 10 degrees Celsius.

The evaluation of the tolerability to bending of the light-emitting devices according to each example and each comparative example was determined by the presence or absence of defects such as cracking in the light-emitting element layer 8 and the touch panel layer 18 of the light-emitting devices according to each example and each comparative example after the bending test described above. In a case in which a defect was found in either the light-emitting element layer 8 or the touch panel layer 18, the evaluation result was indicated as "Poor." In a case in which a defect was not found in either the light-emitting element layer 8 or the touch panel layer 18, the evaluation result was indicated as "Good."

The evaluations of pencil hardness and tolerability to bending for the light-emitting devices according to each example and each comparative example are shown in Table 4 below.

TABLE 4

|  |  | Comparative example 1 | Comparative example 2 | Example 1 | Example 2 | Example 3 |
|---|---|---|---|---|---|---|
| Pencil hardness |  | Poor (8B) | Poor (2B) | Good (2H) | Good (3H) | Good (3H) |
| Bending tolerability | Room temperature | Good | Poor | Good | Good | Good |
|  | Low temperature | Good | Poor | Poor | Good | Good |

In Table 4, the "Pencil hardness" row shows the evaluation of pencil hardness of the light-emitting devices according to each example and each comparative example along with the measurement value of pencil hardness at the outermost surface on the window film 4 side. The measurement value of pencil hardness here indicates a maximum hardness of the pencil that did not cause scratches on the outermost surface on the window film 4 side after the measurement test of pencil hardness described above. Further, the "Bending tolerability" "Room temperature" row indicates the evaluation of tolerability to bending of the light-emitting devices according to each example and each comparative example after the bending test under room temperature described above. The "Bending tolerability" "Low temperature" row indicates the evaluation of tolerability to bending of the light-emitting devices according to each example and each comparative example after the bending test under low temperature described above.

As shown in Table 4, in the light-emitting device according to comparative example 1, the pencil hardness was a low 8B. Further, in the light-emitting device according to comparative example 2, the pencil hardness was improved to 2B, but did not reach 2H, and the bending tolerability was further evaluated as poor at both room temperature and low temperature.

This is presumably because the adhesives used for each adhesive layer of the light-emitting devices according to each comparative example were all adhesive A and adhesive B having a low shear modulus and used in soft adhesive layers, and thus the pencil hardness could not be sufficiently ensured. Further, from Table 4 it can be seen that only a slight increase in the shear modulus of a portion of adhesive layers may not ensure both pencil hardness and bending tolerability, as in the light-emitting device according to comparative example 2.

On the other hand, the light-emitting device according to example 1 acquires bending tolerability at room temperature while ensuring a pencil hardness of 2 H. Furthermore, the light-emitting devices according to example 2 and example 3 acquire bending tolerability at both room temperature and low temperature while ensuring a pencil hardness of 3 H.

The light-emitting devices according to each example were capable of ensuring pencil hardness presumably because the adhesive C and the adhesive D, each having a high shear modulus and used for a hard adhesive layer, were adopted for at least one of the adhesive layers, and these adhesive layers were thinly formed. Further, the light-emitting devices according to each example were capable of ensuring bending tolerability while maintaining pencil hardness presumably because the adhesive A having a low shear modulus and used for a soft adhesive layer was adopted for at least one of the remaining adhesive layers, and the adhesive layer was thickly formed.

Furthermore, the light-emitting devices according to example 2 and example 3 each have the distance d5, the distance d6, and the distance d7 being greater than 0 µm and no greater than 35 µm. Therefore, the light-emitting devices according to example 2 and example 3 are each provided with a configuration capable of further suppressing a shift in the light-emitting element layer 8 and the touch panel layer 18 in the planar direction of the light-emitting device. Therefore, presumably as a result of the above, the light-emitting devices according to example 2 and example 3 were capable of exhibiting an increase in shear modulus in each adhesive layer, and maintaining bending tolerability even at low temperatures where defects are more likely to occur in the light-emitting element layer 8 and the touch panel layer 18 due to bending.

Second Embodiment

Figure 5:
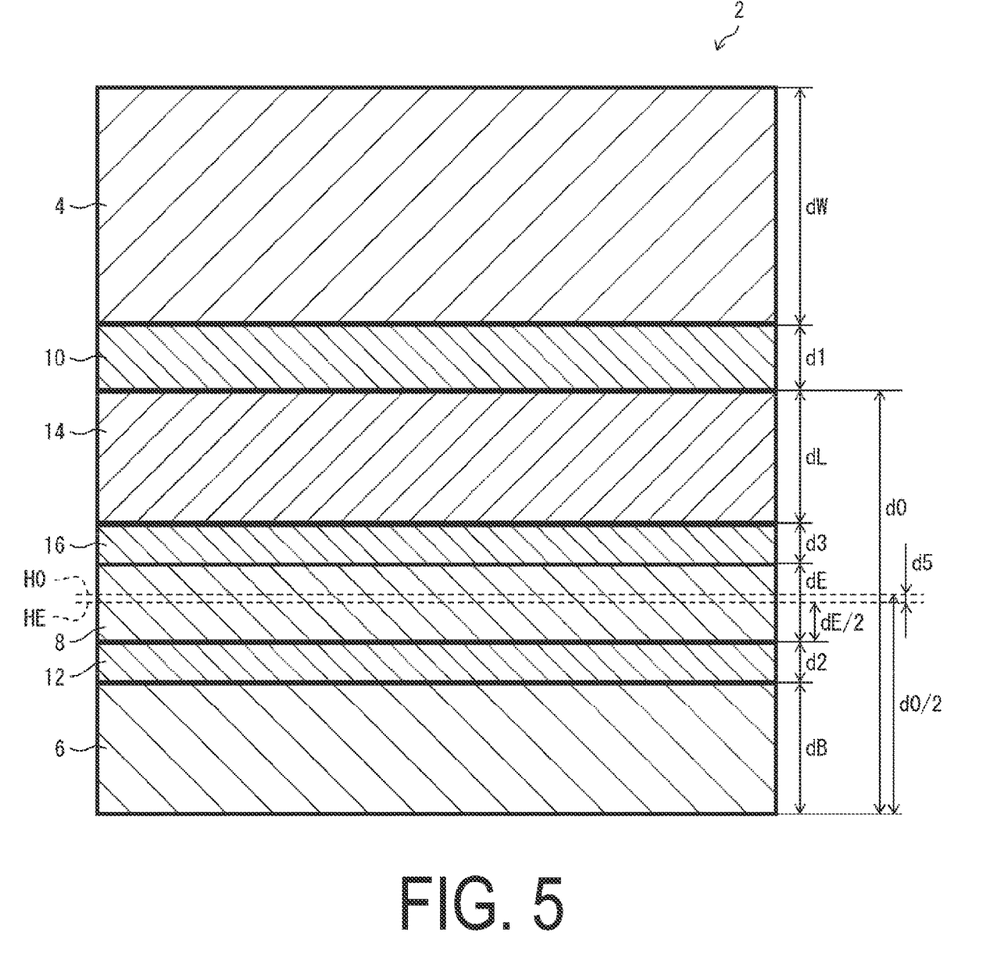
FIG. 5 is a schematic cross-sectional view of the light-emitting device according to a second embodiment of the disclosure.

FIG. 5 is a schematic cross-sectional view of the light-emitting device 2 according to the present embodiment. As illustrated in FIG. 5, the light-emitting device 2 according to the present embodiment differs in configuration in comparison to the light-emitting device 2 according to the previous embodiment in not including the touch panel layer 18.

Therefore, the light-emitting device 2 according to the present embodiment does not include the fourth adhesive layer 20 as well. Further, the third adhesive layer 16 bonds the light-emitting element layer 8 and the optical layer 14.

In the present embodiment, the touch panel may be built into the light-emitting element layer 8. In other words, in the present embodiment, the light-emitting element layer 8 may include an in-cell touch panel.

Except for the point described above, the light-emitting device 2 according to the present embodiment may have the same configuration as that of the light-emitting device 2 according to the previous embodiment.

The light-emitting device 2 according to the present embodiment includes, similarly to the light-emitting device 2 according to the previous embodiment, the first adhesive layer 10 having a thick film thickness and a low shear modulus under room temperature between the window film 4 and the light-emitting element layer 8 as well as the optical layer 14. Furthermore, the light-emitting device 2 according to the present embodiment includes the second adhesive layer 12 and the third adhesive layer 16, each having a thin film thickness and a high shear modulus under room temperature, between the back film 6 and the light-emitting element layer 8, and between the light-emitting element layer 8 and the optical layer 14, respectively.

Accordingly, the light-emitting device 2 according to the present embodiment, similarly to the light-emitting device 2 according to the previous embodiment, has the effect of ensuring the pencil hardness at the surface while suppressing the occurrence of defects in the light-emitting element layer 8.

In the present embodiment, d0, which is the total thickness from the back film 6 to the optical layer 14, is dB d2 dE d3 dL. Further, in the present embodiment as well, the distance d5 between the center position HE and the center position HO is expressed as, for example, |d0/2-(dB+d2+dE/2)|.

For the same reason as the reason described in the previous embodiment, in the present embodiment as well, the distance cis is preferably from 0 µm to 35 µm. As long as the distance d5 is within this range, it is possible to suppress the occurrence of defects in the light-emitting element layer 8 associated with the bending of the light-emitting device 2.

Third Embodiment

Figure 6:
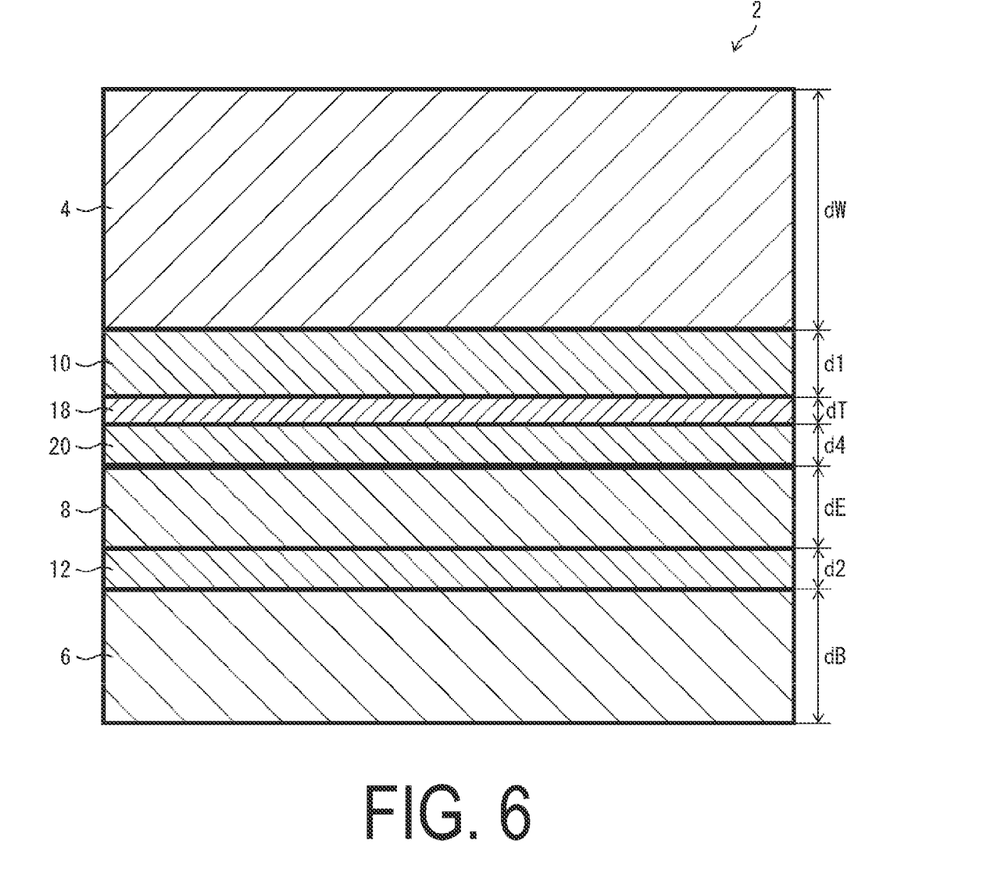
FIG. 6 is a schematic cross-sectional view of the light-emitting device according to a third embodiment of the disclosure.

FIG. 6 is a schematic cross-sectional view of the light-emitting device 2 according to the present embodiment. As illustrated in FIG. 6, the light-emitting device 2 according to the present embodiment differs in configuration in comparison to the light-emitting device 2 according to the first embodiment in not including the optical layer 14. Therefore, the light-emitting device 2 according to the present embodiment does not include the third adhesive layer 16 as well. Further, the first adhesive layer 10 bonds the window film 4 and the touch panel layer 18.

In the present embodiment, the optical layer may be built into the light-emitting element layer 8. For example, the light-emitting element layer 8 may include a circular polarizing film in which a linear polarizing film and a λ/4 retardation film are layered as the optical layer. Further, the optical layer in the light-emitting element layer 8 may be formed by repeating application formation of an alignment film and light irradiation on the alignment film.

Except for the point described above, the light-emitting device 2 according to the present embodiment may have the same configuration as that of the light-emitting device 2 according to each embodiment previously described.

The light-emitting device 2 according to the present embodiment includes, similarly to the light-emitting device 2 according to the embodiments described above, the first adhesive layer 10 having a thick film thickness and a low shear modulus under room temperature between the window film 4 and the light-emitting element layer 8 as well as the touch panel layer 18. Furthermore, the light-emitting device 2 according to the present embodiment includes the second adhesive layer 12 and the fourth adhesive layer 20, each having a thin film thickness and a high shear modulus under room temperature, between the back film 6 and the light-emitting element layer 8, and between the light-emitting element layer 8 and the touch panel layer 18, respectively.

Accordingly, the light-emitting device 2 according to the present embodiment, similarly to the light-emitting device 2 according to the previous embodiment, has the effect of ensuring the pencil hardness at the surface while suppressing the occurrence of defects in the light-emitting element layer 8 and the touch panel layer 18.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each oft embodiments.

REFERENCE SIGNS LIST

2 Light-emitting device (display device)
4 Window film (first layer)
6 Back film (second layer)
8 Light-emitting element layer
10 First adhesive layer
12 Second adhesive layer
14 Optical layer
16 Third adhesive layer
18 Touch panel layer
20 Fourth adhesive layer
24 Light-emitting, element

The invention claimed is:

1. A light-emitting device comprising:
a first layer;
a second layer;
a light-emitting element layer positioned between the first layer and the second layer and including a light-emitting element;
a first adhesive layer positioned between the first layer and the light-emitting element layer and having a thickness of 10 μm or greater and less than 25 μm, the first adhisive layer further having a shear modulus, at 23 degrees Celsius, of 4.0E +04 Pa or greater and less than 1.0E+05 Pa; and
a second adhesive layer positioned between the light-emitting element layer and the second layer and having a thickness of greater than 0 μm and no greater than 15 μm, the second adhesive layer further having a shear modulus, at 23 degrees Celsius, of 1.0E+05 Pa or greater, wherein
light from the light-emitting element is extracted from the light-emitting element layer to a side of the first layer, and
the first layer is a window film or a cover glass.

2. The light-emitting device according to claim 1,
wherein the first adhesive layer further has a shear modulus, at minus 20 degrees Celsius, of 4.0E+04 Pa or greater and less than 5.0E+05 Pa, and
the second adhesive layer further has a shear modulus, at minus 20 degrees Celsius, of 1.0E+06 Pa or greater.

3. The light-emitting device according to claim 1, wherein the second layer is a back film or a glass substrate.

4. The light-emitting device according to claim 1, further comprising:
a touch panel layer positioned between the light-emitting element layer and the first adhesive layer; and
a fourth adhesive layer positioned between the light-emitting element layer and the touch panel layer and having a thickness greater than 0 μm and no greater than 15 μm, the fourth adhesive layer further having a shear modulus, at 23 degrees Celsius, of 1.0E+05 Pa or greater.

5. The light-emitting device according to claim 4,
wherein the fourth adhesive layer further has a shear modulus, at minus 20 degrees Celsius, of 1.0E+06 Pa or greater.

6. A light-emitting device comprising:
a first layer;
a second layer;
a light-emitting element layer positioned between the first layer and the second layer and including a light-emitting element;
a first adhesive layer positioned between the first layer and the light-emitting element layer and having a thickness of 10 μm or greater and less than 25 μm, the first adhesive layer further having a shear modulus, at 23 degrees Celsius, of 4.0E+04 Pa or greater and less than 1.0E+05 Pa;
a second adhesive layer positioned between the light-emitting element layer and the second layer and having a thickness of greater than 0 μm and no greater than 15 μm, the second adhesive layer further having a shear modulus, at 23 degrees Celsius, of 1.0E+05 Pa or greater;
an optical layer positioned between the light-emitting element layer and the first adhesive layer; and
a third adhesive layer positioned between the light-emitting element layer and the optical layer and having a thickness greater than 0 μm and no greater than 15 μm, the third adhesive layer further having a shear modulus, at 23 degrees Celsius, of 1.0E+05 Pa or greater.

7. The light-emitting device according to claim 6,
wherein the third adhesive layer further has a shear modulus, at minus 20 degrees Celsius, of 1.0E+06 Pa or greater.

8. The light-emitting device according to claim 6,
wherein a distance from a center position of a total thickness from the second layer to the optical layer to a center position of a thickness of the light-emitting element layer is from 0 μm to 35 μm.

9. A light-emitting device comprising:
a first layer;
a second layer;
a light-emitting element layer positioned between the first layer and the second layer and including a light-emitting element;

a first adhesive layer positioned between the first layer and the light-emitting element layer and having a thickness of 10 μm or greater and less than 25 μm, the first adhesive layer further having a shear modulus, at 23 degrees Celsius, of 4.0E+04 Pa or greater and less than 1.0E+05 Pa;

a second adhesive layer positioned between the light-emitting element layer and the second layer and having a thickness of greater than 0 μm and no greater than 15 μm, the second adhesive layer further having a shear modulus, at 23 degrees Celsius, of 1.0E+05 Pa or greater;

an optical layer positioned between the light-emitting element layer and the first adhesive layer;

a third adhesive layer positioned between the light-emitting element layer and the optical layer and having a thickness greater than 0 μm and no greater than 15 μm, the third adhesive layer further having a shear modulus, at 23 degrees Celsius, of 1.0E+05 Pa or greater;

a touch panel layer positioned between the light-emitting element layer and the third adhesive layer; and a fourth adhesive layer positioned between the light-emitting element layer and the touch panel layer and having a thickness greater than 0 μm and no greater than 15 μm, the fourth adhesive layer further having a shear modulus, at 23 degrees Celsius, of 1.0E+05 Pa or greater.

10. The light-emitting device according to claim 9,
wherein the third adhesive layer further has a shear modulus, at minus 20 degrees Celsius, of 1.0E+06 Pa or greater, and
the fourth adhesive layer further has a shear modulus, at minus 20 degrees Celsius, of 1.0E+06 Pa or greater.

11. The light-emitting device according to claim 9,
wherein a distance from a center position of a total thickness from the second layer to the optical layer to a center position of a thickness of the light-emitting element layer is from 0 μm to 35 μm.

12. The light-emitting device according to claim 11,
wherein a distance from the center position of the thickness of the light-emitting element layer to a center position of a thickness of the touch panel layer is longer than 0 μm and no longer than 35 μm.

13. The light-emitting device according to claim 9,
wherein a distance from a center position of a total thickness from the second layer to the optical layer to a center position of a thickness of the touch panel layer is from 0 μm to 35 μm.

14. A display device comprising:
the light-emitting device according to claim 1.

15. A display device comprising:
the light-emitting device according to claim 6.

16. A display device comprising:
the light-emitting device according to claim 9.

* * * * *